(12) United States Patent
Haas et al.

(10) Patent No.: US 9,805,143 B2
(45) Date of Patent: *Oct. 31, 2017

(54) COMPOSITE SIMULATION MODELING AND ANALYSIS

(71) Applicant: International Business Machines Corporation, Armonk, NY (US)

(72) Inventors: Peter J. Haas, San Jose, CA (US); Cheryl A. Kieliszewski, San Jose, CA (US); Paul P. Maglio, Catheys Valley, CA (US); Ronald Mak, San Jose, CA (US); Patricia G. Selinger, San Jose, CA (US); Wang-Chiew Tan, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 876 days.

This patent is subject to a terminal disclaimer.

(21) Appl. No.: 13/750,806

(22) Filed: Jan. 25, 2013

(65) Prior Publication Data

US 2014/0214382 A1 Jul. 31, 2014

(51) Int. Cl.
G06G 7/48 (2006.01)
G06F 17/50 (2006.01)

(52) U.S. Cl.
CPC .................. *G06F 17/5009* (2013.01)

(58) Field of Classification Search
CPC ................................................. G06F 17/5009
See application file for complete search history.

(56) References Cited

U.S. PATENT DOCUMENTS 6,609,085 B1 8/2003 Uemura et al.
7,027,516 B2 4/2006 Anderson et al.
(Continued)

FOREIGN PATENT DOCUMENTS

CN 102750309 A 10/2012
GB 2310118 A 8/1997
WO 2008024153 A2 2/2008

OTHER PUBLICATIONS

Peter J. Haas et al., "Data is Dead . . . Without What-If Models," 2011, Proceedings of the VLDB Endowment, vol. 4, No. 12, four pages.*

(Continued)

*Primary Examiner* — Kamini S Shah
*Assistant Examiner* — Russ Guill
(74) *Attorney, Agent, or Firm* — Cantor Colburn LLP

(57) ABSTRACT

An aspect of handling a plurality of simulated models includes receiving from a first simulation model a stream of source data and determining data processing compatibility between the simulation model and a second-simulation model by i) obtaining metadata relating to the first-simulation models from a memory and ii) obtaining metadata relating to the second simulation model from the memory. An aspect also includes generating a transformation component using a schema mapping tool for providing compatibility between the first and second simulation models upon a determination that the compatibility does not exist between the two models. The—transformation component is generated—using the metadata relating to the first and second simulation models. The method also includes generating a—stream of target data by the second simulation model via the transformation component. The second simulation model uses the stream of source data as input.

21 Claims, 9 Drawing Sheets

(56) References Cited

U.S. PATENT DOCUMENTS

| | | | |
|---|---|---|---|
| 7,194,394 B2 | 3/2007 | Dorfman et al. | |
| 7,421,380 B2 | 9/2008 | Thiesson et al. | |
| 7,631,319 B2 | 12/2009 | Miller et al. | |
| 7,660,707 B2 | 2/2010 | Maruyama et al. | |
| 7,716,011 B2 | 5/2010 | Thibaux et al. | |
| 8,712,740 B2 | 4/2014 | Morio et al. | |
| 8,976,778 B2 | 3/2015 | Bedrosian | |
| 9,201,989 B2 | 12/2015 | Haas et al. | |
| 9,210,675 B2 | 12/2015 | Dinan | |
| 9,449,122 B2 | 9/2016 | Haas et al. | |
| 2002/0001795 A1* | 1/2002 | Bejar | G09B 7/02 434/350 |
| 2002/0023175 A1* | 2/2002 | Karlak | G06F 9/4843 719/314 |
| 2007/0118041 A1 | 5/2007 | Nishiura et al. | |
| 2007/0147519 A1 | 6/2007 | Takayama et al. | |
| 2007/0157162 A1* | 7/2007 | Ciolfi | G06F 17/5009 717/105 |
| 2007/0233435 A1 | 10/2007 | Bradski | |
| 2009/0030614 A1 | 1/2009 | Carnegie et al. | |
| 2009/0281839 A1 | 11/2009 | Lynn et al. | |
| 2010/0064275 A1 | 3/2010 | Akkiraju et al. | |
| 2010/0077386 A1 | 3/2010 | Akkiraju et al. | |
| 2011/0066411 A1 | 3/2011 | Morio et al. | |
| 2011/0066649 A1 | 3/2011 | Berlyant et al. | |
| 2011/0243271 A1 | 10/2011 | Takahashi et al. | |
| 2011/0283099 A1 | 11/2011 | Nath et al. | |
| 2011/0295774 A1 | 12/2011 | Chen et al. | |
| 2013/0290367 A1 | 10/2013 | Kashiyama | |
| 2014/0172503 A1 | 6/2014 | Hammerstrom et al. | |
| 2014/0214382 A1 | 7/2014 | Haas et al. | |

OTHER PUBLICATIONS

Melissa Cefkin, "Splash: a progress report on combining simulations for better health policy (Extended Abstract)," 2011, Informs Healthcare 2011, two pages.*

Leila Jalali et al., "Multisimulations: towards next generation integrated simulation environments," in "Formal Modeling: Actors, Open Systems, Biological Systems," 2011, Springer-Verlag, pp. 352-367.*

Peter J. Haas, "Composite simulation modeling of complex service systems: example and research challenges," 2011 INFORMS Simulation Society Research Workshop 2011, 31 pages.*

Juergen Geiser, "Decomposition method for differential equations Theory and Applications," 2009, Taylor & Francis, p. 40.*

Bergland, John et al., "Integrating Systems Through Universal Transformation Using IBM WebSphere Transformation Extender", Websphere Software, IBM Corp. 2009, 28 pages.

Hudson, M. et al., "Simplication of Semantically-Rich Model Transformations Through Generated Transformation Blocks", 2011 18th IEEE International Conference and Workshops on Engineering of Computer-Based Systems, pp. 261-268.

IBM, "Automated Ontological Mapping for Metadata", IP.com Publication IPCOM000191276D, publication date: Dec. 24, 2009, 5 pages.

Tan, Wang-Chiew et al., "Splash: A Platform for Analysis and Simulation of Health", IHI '12, Jan. 28-30, 2012, Miami FL, USA, 10 pages.

U.S. Appl. No. 13/750,751; Non-Final Office Action: filed, Jan. 25, 2013; Date Mailed: Mar. 31, 2015; 17 pages.

U.S. Appl. No. 13/750,789; Non-Final Office Action, filed Jan. 25, 2013; Date Mailed Jun. 11, 2015; 22 pages.

Cefkin, Melissa et al., "Splash: A Progress Report on Building a Platform for a 360 Degree View of Health", Proceedings of the 5th INFORMS Workshop on Data Mining and Health Informatics (DM-HI 2010), 6 pages.

Haas, Laura M. et al., "Clio Grows Up: From Research Prototype to Industrial Tool", SIGMOD 2005 Jun. 14-16, pp. 805-810.

Howe, Bill, "SciDB Examples from Environmental Observation and Modeling", Oregon Health & Science University Center for Coastal Margin Observation and Prediction, Nov. 19, 2008, 9 pages.

Howe, Bill and Maier, David, "Algebraic manipulation of scientific datasets", VLDB Journal (2005) 14(4): pp. 397-416.

Huang, Yun-Wu and Yu, Philip S., "Adaptive Query Processing for Time-Series Data", ACM 1999 1-58113-143-7/99/08, pp. 282-286.

Paige, C. C. et al., "Solution of Sparse Indefinite Systems of Equations and Least Square Problems", Database entry Copyright (c) Software Patent Institute, IPCOM000150589D, electronic publication Apr. 18, 2007, 50 pages.

Splash: A Progess Report on Combining Simulations for Better Health Policy (Extended Abstract), Melissa Cefkin, Susanne M. Glissmann, Peter J. Haas, Cheryl A Kieliszewski, Paul P. Maglio, Ronald L. Mak, Patricia Selinger, Wang-Chiew Tan (Abstract), 2011.

Splash: A progress report on combining simulations for better health policy; Melissa Cefkin, Susanne M. Glissmann, Peter J. Haas, Yinan Li, Paul P. Maglio, Ronald Mak, Patricia Selinger, Wang-Chiew Tan; www.almaden.ibm.com/asr/projects/splash, 2011.

* cited by examiner

FIG. 5

BMI.sadl

```xml
<Actor name="BMI Model" type = "model" model_type = "simulation"
       sim_type = "continuous-deterministic"owner="Jane Modeler">
  <Description>
  Predict weight change over time based on an individual's energy and food
  intake. Implemented in C. Reference: http://csel/asu.edu/?q=Weight
  </Description>
  <Environment>
    <Variable name="EXEC_DIR" default="/Splash" description="executable
directory path"/>
    <Variable name="SADL_DIR" default="/Splash/SADL" description="schema
directory path"/>
  </Environment>
  <Execution>
    <Command>$EXEC_DIR/Models/BMIcalc.out</Command>
    <Title>Run BMI model</Title>
  </Execution>
  <Arguments>
    <Input name="demographics" sadl="$SADL_DIR/BMIInput.sadl"
           description="demographics data"/>
    <Output name="people" sadl="$SADL_DIR/BMIOutput.sadl"
           description=" daily calculated BMI per individual"/>
  </Arguments>
</Actor>
```

FIG. 7A

BMIInput.sadl

<Actor name="BMIInput" type="data" data_type = "time_series">
<Description>Metadata of input data file of the BMI model.</Description>
<Time type="continuous" observations="regular" field="tick" unit="day" value="1"></Time>
<Data>
   <Source mode="file" uri="$EXEC_DIR/Data/BMIInput.del"/>
   <Schema type="xsd" uri="$SADL_DIR/Schemas/BMIInput.xsd"/>
   <Format type="del" delimiter=","/>
</Data>
<Attributes>
   <name="tick" unit="day"/>
   <name="weight" unit="pound"
    description="weight measured before breakfast"/>
   <name="height" unit="inch"/>
     :
</Attributes>
</Actor>

BMIInput.xsd

<Element name="tick" type="double"/>
<Element name="weight" type="double"/>
<Element name="height" type="double"/>
<Element name="gender" type="string"/>
<Element name="income" type="string"/>
    :

FIG. 7B

COMPOSITE SIMULATION MODELING AND ANALYSIS

BACKGROUND

The present disclosure relates generally to simulation and more particularly to composite simulation modeling and analysis.

Making good policy, planning, and investment decisions requires not just the gathering, mining, statistical analysis, and visualization of data, but also the use of simulation models that can predict future system behaviors. This is to help analyze the potential impacts of alternative decisions on future outcomes. Such modeling and analysis is very challenging, because high-level decisions frequently require understanding complex interactions of diverse systems across a great many domains and disciplines.

High-level health decisions, for example, can require understanding of interactions involving factors both inside and outside of healthcare, such as genetics, behavior, environment, government policy, education and even international trade. No single dataset, model, or knowledgebase system can capture all facets of such complex "systems of systems", and there is a need for experts across widely different domains to combine their data and models.

Composing simulation models is extremely hard, because domain experts have different worldviews, use different vocabularies, sit in different organizations, and have often invested considerable effort in developing and implementing their models using different programming paradigms and development platforms. Prior approaches to simulation model composition include writing a single monolithic model, creating component models that are then compiled together, adopting common standards and interfaces, or deploying distributed-simulation frameworks in which custom communication logic is added to existing models, which are then run in a tightly synchronized manner.

All of these prior approaches have drawbacks that hinder cross-disciplinary collaboration. Monolithic models are usually difficult and expensive to build, verify, validate, and maintain, and require fine grained collaboration across disciplines and organizations. Both traditional component modeling and distributed simulation approaches typically require extensive re-coding of existing models. Requiring the use of common standards across heterogeneous scientific and engineering disciplines is unrealistic in practice.

BRIEF SUMMARY

Embodiments include methods, and computer program product for handling a plurality of simulation models. One method includes receiving from a first simulation model a stream of source data and determining data processing compatibility between the simulation model and a second simulation model by i) obtaining metadata relating to the first simulation models from a memory and ii) obtaining metadata relating to the second simulation model from the memory. The method also includes generating a transformation component using a schema mapping tool for providing compatibility between the first and second simulation models upon determination that the compatibility does not exist between the two models. The transformation component is generated using the metadata relating to the first and second simulation models. The method also includes generating a stream of target data by the second simulation model via the transformation component. The second simulation model uses the stream of source data as input.

In an alternate embodiment a method for combining simulation model is provided. The method includes specifying a desired behavior of a transformation component using a schema mapping tool on descriptions in a meta-language and automatically creating the transformation component from the specified behavior, wherein the component corrects discrepancies between source data and target data.

In yet another alternate embodiment, a method is provided for invoking simulation models by synthesizing an operating system command line from a description in a meta-language that specifies the inputs and outputs of a simulation model.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the disclosure are apparent from the following detailed description taken in conjunction with the accompanying drawings in which:

FIG. 5 depicts a screen display example illustrating a visual time alignment interface in accordance with an embodiment;

FIG. 7(a) is a depiction showing an example where a snippet of SADL language description of a BMI component model is provided for an obesity-policy example in accordance with an embodiment; and FIG. 7(b) is a depiction showing an example where a snippet of a SADL a language description of an input data source for a BMI component model is provided in an obesity-policy example in accordance with an embodiment.

DETAILED DESCRIPTION

Figure 1:
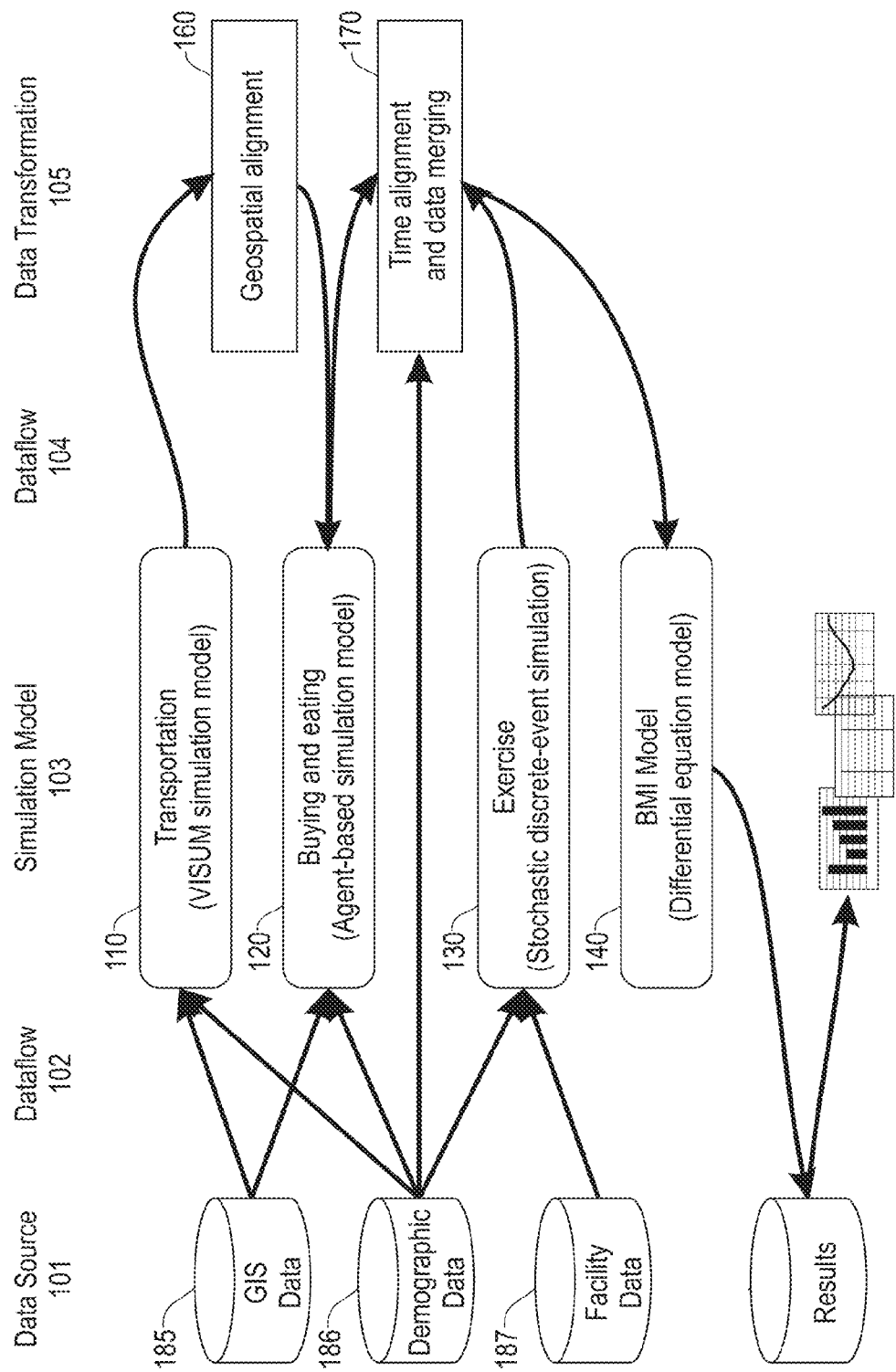
FIG. 1 depicts an exemplary diagram illustrating composition of a plurality of individual simulation models in accordance with an embodiment.
Figure 2:
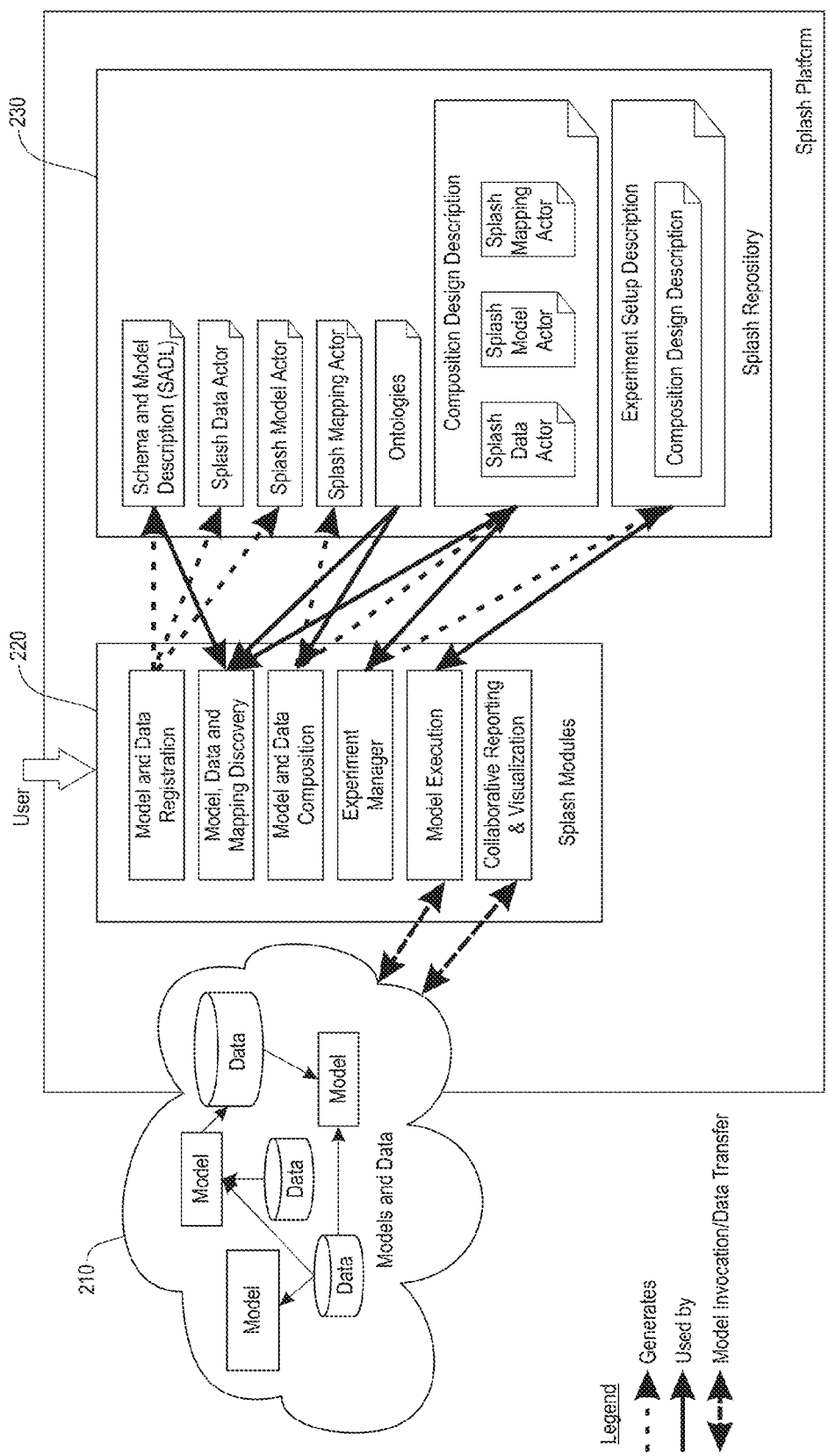
FIG. 2 depicts a block diagram illustrating the "Splash" system in accordance with an embodiment.

Making sound planning, policy and investment decisions in complex areas such as population health and safety requires not just the gathering, mining, statistical analysis, and visualization of data, but also the use of a plurality of diverse simulation models that can be composed to predict the potential effects of alternative decisions. For example, the problem of chronic obesity is influenced by a broad array of factors at many levels, such as individual psychology and metabolism, food prices, advertising, transportation, agriculture, education, sanitation, government policies, and international trade. The analysis of these factors requires a systems-oriented approach to modeling that spans many disciplines. It is thus important to have a comprehensive system-based simulation modeling approach to gain a synergistic understanding of the underlying determinants of complex systems such as health in order to assess intended and unintended outcomes associated with policy, funding, investment, and resource decisions. This systems-oriented approach creates a need for experts across widely different domains to combine their data and models.

FIGS. 1 through 8 illustrate different aspects and embodiments of the present invention. As will be discussed, these embodiments provide a method for creating and executing a composite simulation model that comprises a plurality of heterogeneous models relating to different aspects of a problem. The composite simulation model allows a comprehensive analysis of relevant factors across many domains to ensure robust policy decisions. For ease of explanation, the Splash system for simulation-model composition is used to explain the present invention but with the understanding that as appreciated by those skilled in the art other similar model-composition systems can be utilized.

Splash is a decision-support framework that facilitates combining heterogeneous, pre-existing simulation models and data from different domains and disciplines. Various aspects of the Splash system architecture and capabilities correspond to embodiments of the present invention. Splash leverages and extends data integration, simulation, and scientific-workflow technologies to permit loose coupling of models via data exchange. This approach avoids the need to enforce universal standards for data and models or to extensively re-code pre-existing models, thereby facilitating interoperability and reuse of models and data that were independently created or curated by different individuals or organizations. In this way Splash can help domain experts from different areas collaborate effectively and efficiently to conduct deep predictive analytics, enabling "what-if" analyses that cut across disciplines, attacking complex problems that cannot be solved using expertise from only a single domain.

The basic technical approach underlying Splash is semi-automated, loose coupling of models via data exchange. In Splash, models run asynchronously and communicate with each other by reading and writing datasets via file I/O, database accesses, or web-service calls, and data transformations are applied as needed for compatibility. Fully automated composition of tightly coupled simulation models is well known to be extremely challenging. Splash simplifies the problem by exploiting and extending techniques from semi-automated data integration. The idea is to provide graphical user interfaces (GUIs) that simplify both selection of component models and specification of complex mappings between the input and output datasets for these models, while automating more mundane tasks such as conversion of measurement units, spatiotemporal alignment between models, and statistical calculations.

Scientific-workflow technologies are exploited to orchestrate execution of the final, composite model. Both models and data may be distributed across different platforms. Splash relies heavily on user-supplied metadata about data sources, component models, and mappings; this metadata is specified in a unified manner using a novel, XML-based Splash Actor Description Language (SADL).

The embodiments of the present invention will be explained using an exemplary application of Splash to create a simple, proof-of-concept composite simulation model related to the problem of community obesity discussed previously. As will be explained in the embodiments, it is shown how independently created models of transportation, eating habits, food-shopping choices, exercise, and human metabolism can be combined with geographic data, store location data, and population data to explore the potential consequences of health policy decisions on obesity for a hypothetical urban community. An example of a policy question related to obesity is: "How would a community's average body mass index or BMI change if grocery chains selling healthy and inexpensive food received tax breaks for building stores near obesity hot spots?" (Such hot spots often correspond to low-income areas.)

THE OBESITY SCENARIO—A hypothetical obesity scenario is now discussed along with some relevant component models and datasets. Splash can be used to combine these models and data into a composite model suitable for what-if analysis. In this scenario, government policy makers want to determine the most cost-effective way to reduce obesity, which in this case would be the BMI level, in the population of an urban area. There are many possible approaches. For example, the government could provide incentives for a supermarket chain to place a store that sells healthy and reasonably priced food at a specific location, or build more playgrounds in certain neighborhoods, or give citizens a tax credit for enrolling in an exercise program, or spend more on nutrition education in schools. Which combination of these approaches is most cost effective? Diverse factors influence obesity levels, including transportation, buying and eating behavior, availability of exercise facilities, and the impact of each on individual and aggregate BMI values. In one embodiment, the obesity scenario entails models of these factors, as well as the datasets that feed these models. The data sources are heterogeneous and independently created, as are the models, which also rely on differing technologies such as programming languages, operating systems, simulation paradigms, and so on. The component models and datasets used in the proof-of-concept composite model are now described.

FIG. 1 illustrates the exemplary composite obesity simulation model that is to be created and executed using one embodiment of the current invention. As indicated in the top, the process of executing this composite model involves obtaining data from the portion 101 and executing individual existing component simulation models 103. Data transformations 105 are needed to correct discrepancies between source and target data and in some cases to combine data sources. Specifically, a geospatial data transformation 160 is needed to correct discrepancies between the source data comprising the output of the Transportation model 110 and the target data comprising the input to the Buying and eating model 120. Similarly, a time alignment and data merging transformation 170 is needed to correct discrepancies between the source data comprising the output of the Buying and eating model 120 and the target data comprising the input to the BMI model 140. The transformation 170 also needs to combine the transformed data from the Buying and eating model 120 with Demographic data 186 and the output of the Exercise model 130 to create the target data required by the BMI model 140. Data-flows are indicated by the arrows 102 and 104.

In this particular example, a plurality of simulation models is used: a Transportation model 110, Buying and Eating model 120, Exercise model 130 and BMI model 140. A more detailed explanation will now be discussed with respect to each model for ease of understanding. It is to be appreciated, however, that these four component models and the resulting composite model are only used as an example, and in alternative embodiments other models can be used.

Buying-and-eating model 120—This stochastic agent-based model simulates the grocery-store shopping behavior of households over time, tracking each individual household and grocery store in a hypothetical urban area. The model takes into account the food preferences of each household, travel time to the different grocery stores, the household's purchasing history, and social factors, such as where a household's neighbors are currently shopping. Grocery stores may close down as a result of poor sales and new stores may open. The input to the model comprises travel time information (from a transportation model) and a modifiable set of input parameters, such as the percentage of grocery stores serving healthy food and the percentage of high-income households. The model outputs the state of all households and stores at each simulation tick. The model is implemented using an open source agent-based simulation package.

Transportation Model 110—This model is an off-the-shelf commercial traffic-flow simulation software package that can simulate different modes of public and private transport to determine the impact of traffic demand based on a number of factors, including the road infrastructure and various demand patterns. The model computes various statistics, including the average travel times between different urban zones.

Exercise Model 130—A simple discrete-event stochastic simulation model is used to simulate the use of exercise-facilities by the hypothetical community. This model takes as input a set of parameters such as number of households, number of exercise facilities, capacity of each facility, base calories burned per unit of exercise time at each facility, and probability distributions that govern the frequency and duration of exercise periods for each household. The model returns as output the number of kilocalories burned by each household member per simulation tick. In one embodiment, the model is implemented in the C++ programming language.

BMI Model 140—The BMI model is a deterministic model that predicts daily BMI changes for an individual based on daily food consumption and physical activity, using a "three compartment" energy-balance modeling paradigm. More specifically, the model uses a set of coupled ordinary differential equations that link exercise level and intake of carbohydrates, fat, protein, and sodium to changes in body mass, broken down as lean mass, fat mass and extracellular fluid. These body-mass quantities are added and normalized to obtain BMI. The required initial values for various types of body mass as a function of age, gender, height, and weight were obtained from regression models derived from empirical studies. The input to the model is a time series, for each individual, of their daily food intake, as above, and daily kilocalorie burn rate from exercise. The output is a time series, per individual, of BMI.

Data sources for the exemplary component models comprise a GIS data source 185 which contains geographical information about a hypothetical urban area, such as road networks and zone configurations. The population demographics data source 186 contains information about the characteristics of each person in a household, including age, weight, and height. The exercise facility data source 187 contains information about the exercise facilities in the hypothetical urban area, such as capacity, type of exercise, and so on. Other data sources can be provided (not illustrated) such as a store-demographics data source that describes the nutritional characteristics of the food sold at each store.

Application of Splash—In one embodiment Splash can be applied to create and run the exemplary composite model of FIG. 1. The workings of this embodiment are now discussed. The basic architectural components of Splash are illustrated in the block diagram embodiment of FIG. 2. Using the obesity scenario as an example, in this embodiment the role of each of these components in creating, executing, and analyzing composite simulation models is discussed. All components rely on metadata about models, data sources, and mappings as will be described later. In one embodiment, the SADL language is used to specify this metadata.

In Splash, domain experts contribute (and use) component models and data sources. By component model, a simulation, optimization, statistical or other model implemented as a computer program that takes data as input and produces data as output is intended. Each model carries its own set of assumptions and has its own set of requirements and constraints on the input and output data. A data source or dataset simply refers to a collection of structured or unstructured digital information. Contributors register their models and data sources 210 in the Splash repository 230. A designer of a composite model can use the Splash modules 220 to discover component models and data sources, connect them together, set up and run simulation experiments, and subsequently analyze, visualize, and share the results. The new composite model, as well as any useful data sources generated during the simulation experiments, can be registered in the Splash repository 230 and thus be made available to other model designers.

A more detailed description of each Splash workflow step can now be provided in the context of the obesity example. Models and data must be registered with Splash before they can be used, to create Splash model actors and Splash data actors. These "actors" are components of Splash that encapsulate the framework's knowledge about the various models and data sources. This knowledge is specified via SADL metadata files that are created by the system as part of the registration process. A user can also design and register Splash mapping actors, which handle the data transformations between the outputs of one or more models and the input of another. Splash model, mapping, and data actors are connected to each other in a workflow by the designer of a composite model, and Splash model and mapping actors are invoked for execution during the course of a simulation run.

To create a composite model in Splash, a user will search through the repository to find the most relevant and compatible models and data. In one embodiment, users can provide designs of a composite model by dragging icons, which represent Splash data actors, model actors, and mapping actors, from the repository window and dropping them into the design workspace. The user then connects the components and configures the mapping actors.

Figure 3:
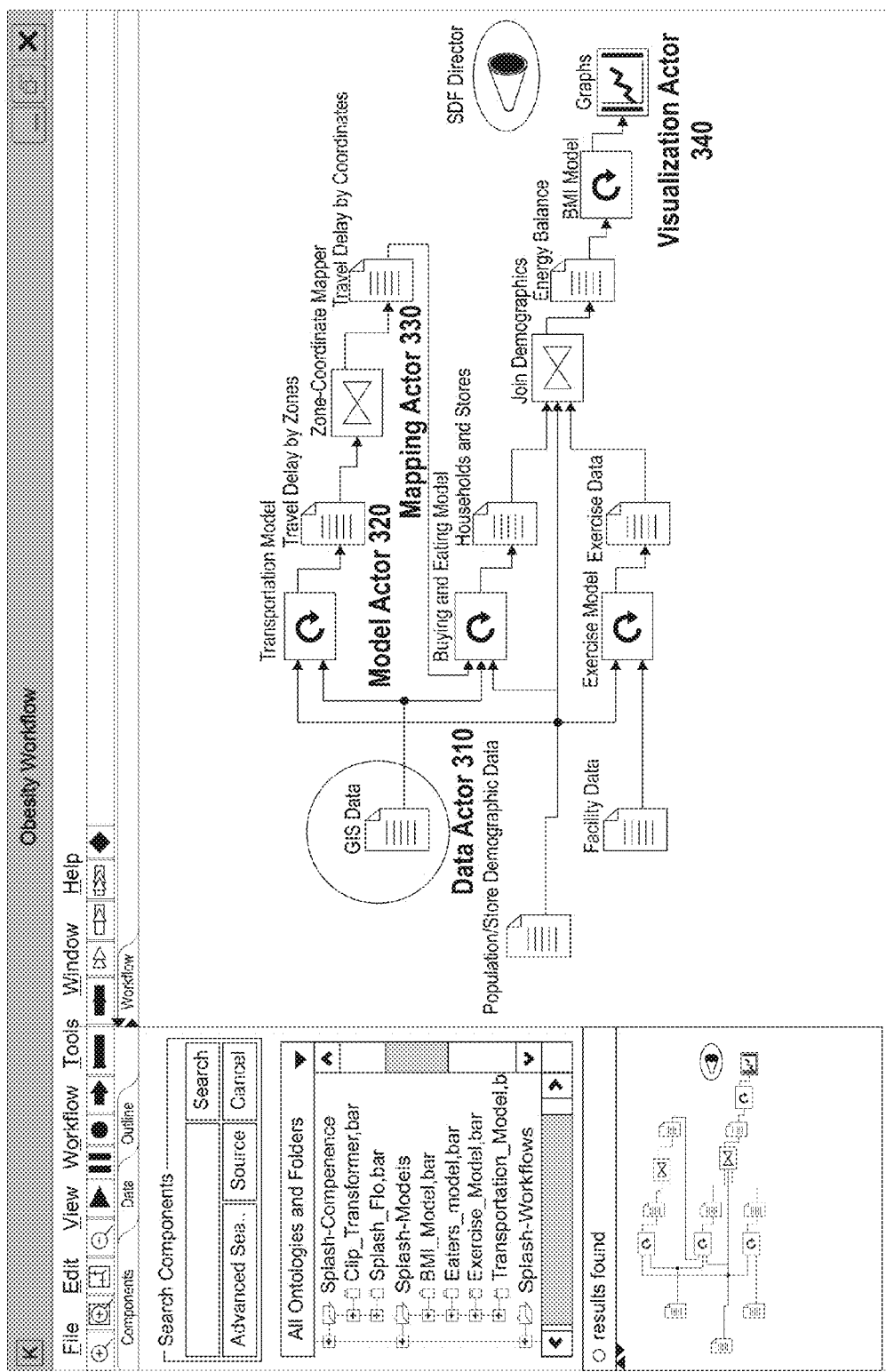
FIG. 3 depicts a screen display example illustrating the Splash graphical representation of a composite model for an obesity example in accordance with an embodiment.

FIG. 3 is an illustration of the graphical representation of a composite model for the obesity example as it appears in the Splash design environment. Data actors 310 provide the input and output files, databases and other related data services such as web services whereas the model actors 320 correspond to component models. The mapping actors 330 provide data transformations such as time and space alignments. The visualization actors 340 provide visually oriented features such as graphs and charts.

A key part of designing a composite model is the design of the various data transformations between component models. As discussed previously, in contrast to tightly-coupled integration frameworks, component models in the present invention are loosely-coupled via data exchange. In other words, models are connected via transformations that convert datasets output by one model into a format suitable for input to another model. In one embodiment, this enables loose coupling by abstracting every data source by a schema and every model by a pair of input and output schemas. The invention then uses a schema-mapping tool together with schema metadata to specify the desired behavior of a transformation and then to automatically generate the code that executes the transformation during a simulation run.

For instance, a schema might specify that patient data are organized as a series of records whose first field is an integer called "patient number," whose second field is a character string called "patient last name", and so forth. Often, the successive records in a data source represent a time series of observations that are input to or output from a simulation model. The schema then specifies the structure of the information recorded at each observation time.

Schema mappings or data transformations refer to specifications of how data are to be translated from one schema (the source schema) into another (the target schema). In one embodiment, they are implemented as Splash mapping actors. For example, the "daily protein purchased" attribute in a source schema that corresponds to the output of a buying-and-eating behavior model might be mapped to the "daily protein ingested" attribute in a target schema that corresponds to the input to a human-metabolism model (assuming 100% ingestion of purchased food). Such mappings are also referred to as structural data transformations, and may also incorporate space-alignment transformations that handle geospatial mismatches.

In one embodiment, the composite simulation model of FIG. 1 can be provided by specifying a desired behavior of a transformation component using such a schema mapping tool on descriptions in a meta-language. With this information, the composite model can then be automatically created via the transformation component from the specified behavior. The transformation component corrects discrepancies between source data and target data. In one embodiment, the detection of such discrepancies is automatic. In one embodiment, a method can be created that invokes simulation models by synthesizing an operating system command line from a description in a meta-language that specifies the inputs and outputs of a simulation model.

Splash can be used with Clio++, an enhanced version of the command line interface operating language (Clio) tool, for design of schema mappings. This can be used in some embodiments to semi-automatically design the different structural data transformations, i.e., to semi-automatically configure the Splash mapping actors. A fully configured Splash mapping actor represents a simulation-specific schema mapping, i.e., a declarative description of the transformation from the outputs of one or more models and data (source schemas), to the input of another model (target schema). Such schema mappings can be used in combination with time-alignment transformations. Time-alignment transformations do not affect the schema, but rather describe how to aggregate, interpolate, or allocate data values to overcome mismatches in time scales between models.

A Splash mapping actor contains information about how to execute its data transformation, along with an optional internal representation of the mapping, and can be registered in the Splash repository for later reuse or modification. The process of semi-automating such simulation-specific schema mappings relies largely on information derived from SADL files of participating models and data sources. In the obesity example, two data transformations are needed. The first data transformation is the zone-coordinate mapping that performs the geospatial alignment 160 in FIG. 1. The transportation model reports average travel times between zones (i.e., regions). However, the buying-and-eating model needs to determine travel times between a household and a grocery store based on geographical coordinates (latitude and longitude). The zone-coordinate mapping is designed to overcome the spatial mismatches between the two models.

The second data transformation is a join-demographics mapping. The structural portion of this data transformation combines the output of the buying-and-eating model and exercise model with the demographics data into a format that can be used as input by the BMI model, handling unit mismatches between outputs and inputs (such as pounds to kilograms). The time-alignment portion of this data transformation handles the time mismatches between the buying and eating model and the exercise model. In one embodiment, Splash automatically detects discrepancies between the schemas of the source and target data, and automatically invokes Clio++ to help the user design the necessary structural data transformations. Similarly, Splash automatically detects discrepancies between the time scales of a source and target dataset, and invokes a tool for designing an appropriate time-alignment transformation to correct the discrepancy.

In Splash, structural data transformations can be specified manually or generated semi-automatically using Clio++. In the obesity example, a preselected and specified (via a custom Java program) zone-coordinate mapping is used which maps (latitude, longitude) coordinate pairs to the corresponding zones used by the transportation model. During a simulation run, the Java program is executed on the output data produced by the transportation model to create a data file containing travel times between pairs of locations, where each location is specified as a (latitude, longitude) coordinate pair; this file is of the form expected by the buying-and-eating model.

For the join-demographics mapping, Clio++ is used to interactively design the data transformation in one embodiment. During the design process, Splash uses the SADL metadata to automatically detect a time mismatch: the buying-and-eating model generates a time series in which a simulation tick corresponds to two days of elapsed time, whereas the BMI model expects a time series in which a simulation tick corresponds to one day of elapsed time. Splash therefore displays a time-aligner GUI so that the user can specify a desired time-alignment transformation (a linear, cubic spline, or nearest-neighbor interpolation in our example).

Figure 4:
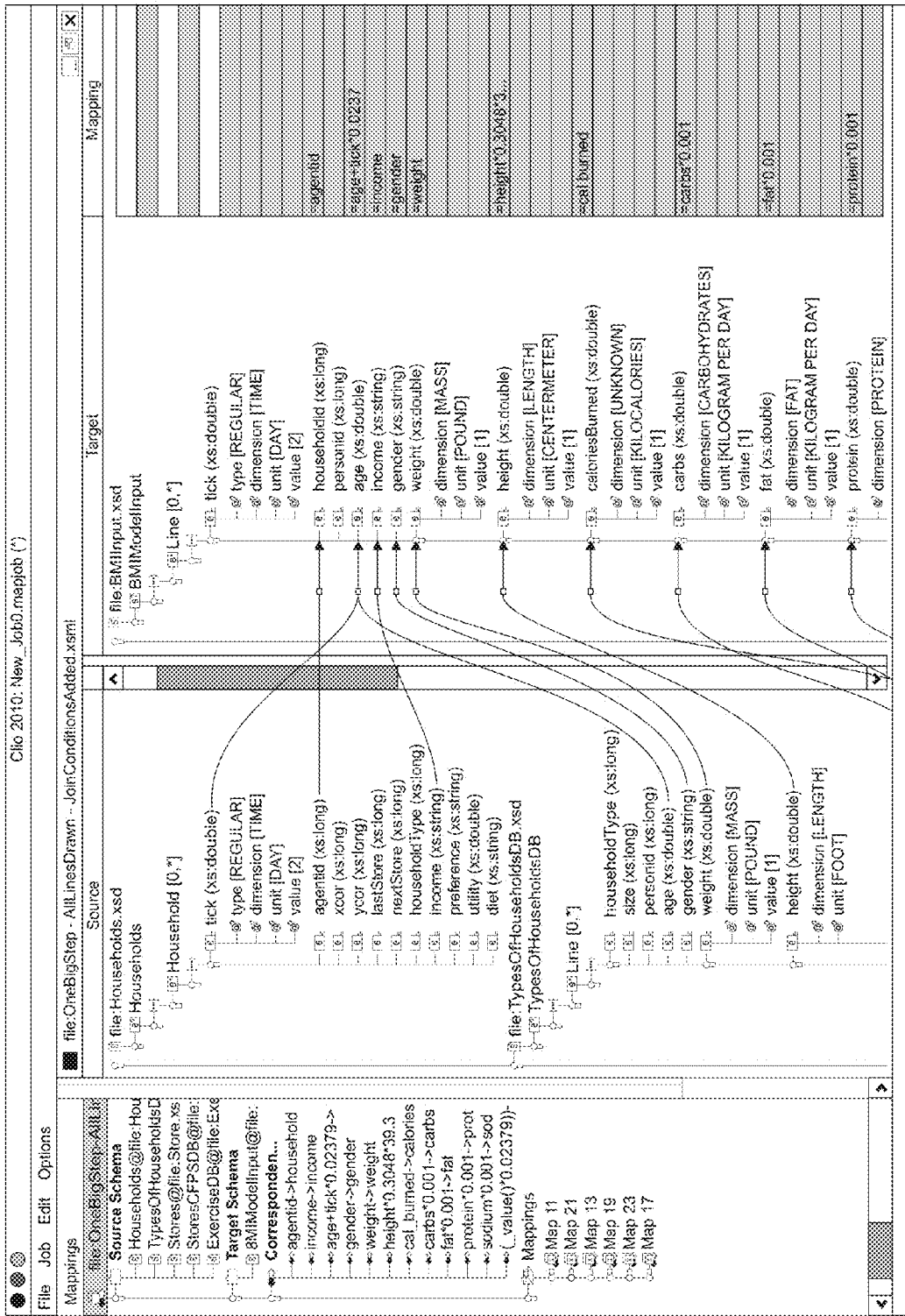
FIG. 4 depicts a screen display example illustrating a visual schema mapping interface for designing a structural data transformation in accordance with an embodiment.
Figure 6A:
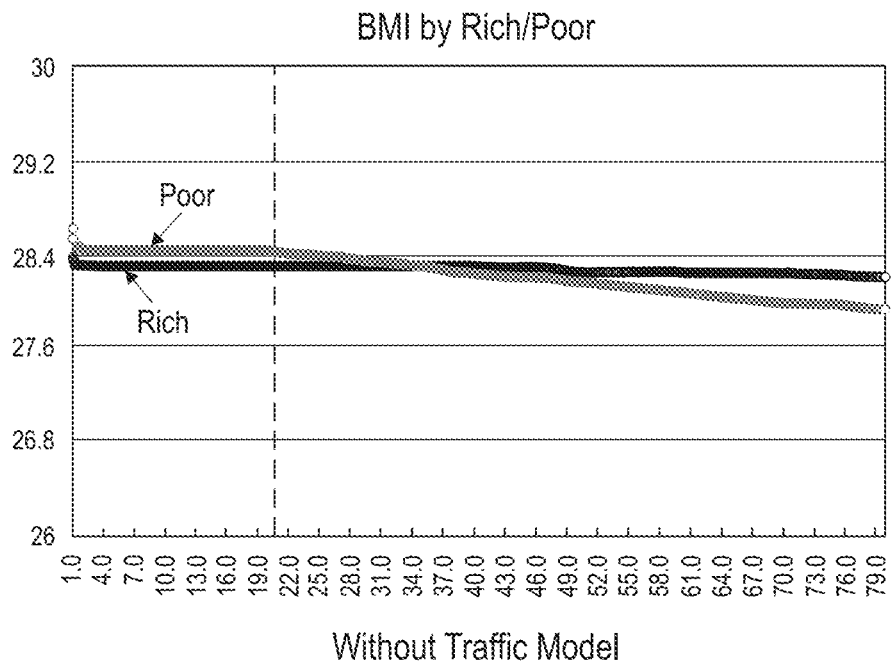
FIGS. 6(a) and (b) are side by side comparison screen display examples showing the effect of alternative approaches to opening a supermarket in a given neighborhood and their long term effects on BMI in accordance with an embodiment.
Figure 6B:
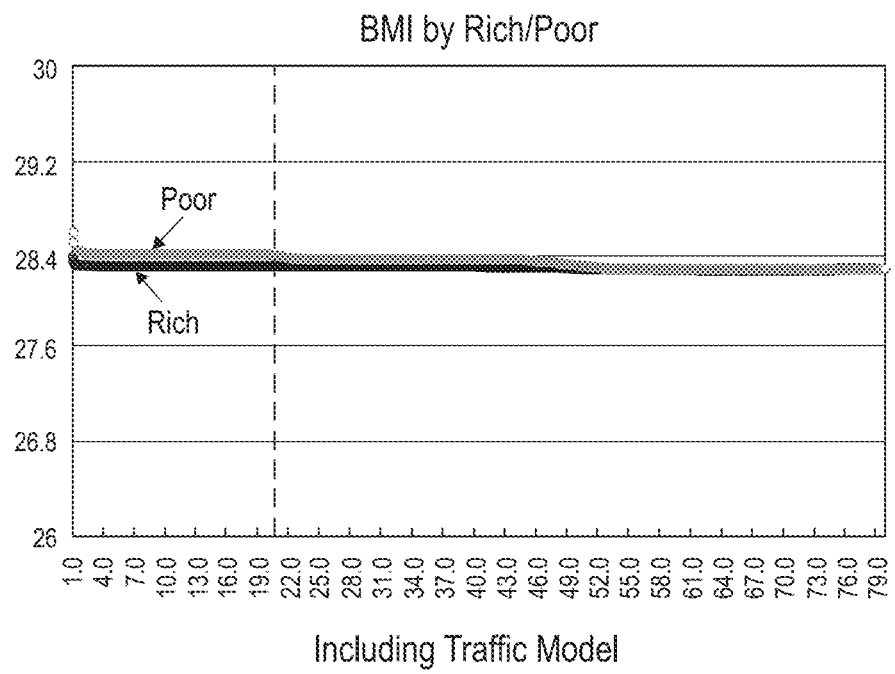

FIG. 4 is an illustration of this exemplary visual schema-mapping tool Clio++, showing how a user can design a structural data transformation by drawing lines to connect attributes in a source and a target schema. This specification determines the procedure by which the demographics data and the various time series produced by the simulation models are joined into the single time series expected by the BMI model. During the process of associating attributes in the source and target schemas, Clio++ automatically generates transformations that correct mismatches in measurement units (such as pounds to kilograms). In one conceived embodiment, the system has the capability to draw an initial set of "suggested" lines between the target and source schemas, which can then be modified by the mapping designer.

Once the visual specification of a mapping is complete, Clio++ automatically compiles the specification into executable code that is invoked during each simulation run of the composite model. In one embodiment, the target platform for such code can be explained in conjunction with Hadoop. Hadoop is a good example because it runs on commodity hardware and is well suited to robust, massive parallel processing of the large amounts of data created by complex simulation models. Looking at FIG. 4, then, one can see how the Splash-generated JAQL code for massive scale data transformation on Hadoop can be used at simulation time to execute the structural transformations of this example.

Figure 5:
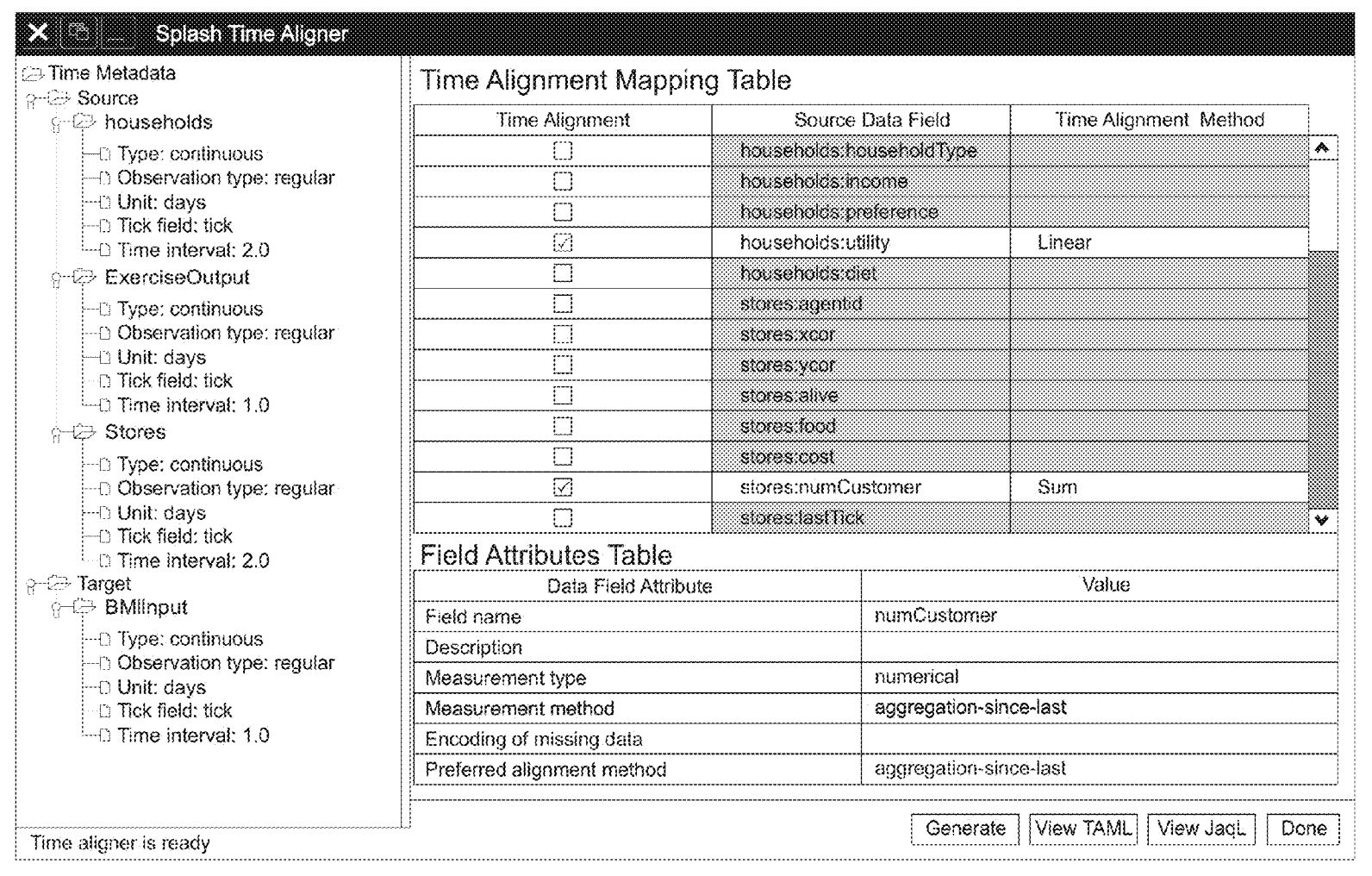

FIG. 5 illustrates an exemplary visual time-alignment interface. In general, the GUI will display a menu of suitable time alignment operations, specifying options for aggregating, interpolating, or allocating time series data to effect a desired time alignment. In Splash, code for time alignments can be generated for execution on Hadoop.

In one embodiment, for each simulation run of the composite model, Splash uses a "director" mechanism to orchestrate the execution of the component Splash model actors and mapping actors. In our example, the transportation model executes first, followed by the zone-coordinate mapper. Then the buying and eating model may execute in parallel with the exercise model. When both models have completed, the join-demographics mapping is executed, followed by execution of the BMI model. More generally, a simulation run may consist of multiple Monte Carlo repetitions.

In the example of the composite obesity model, all models and data sources reside on the same computer as Splash. In general, Splash can execute models remotely. Indeed, upon invocation, a Splash model or mapping actor synthesizes an appropriate command-line string for executing the model or mapping code and sends it to an appropriate destination. The information required to synthesize such a command is obtained from the model's SADL file. This approach exploits the fact that most simulation model execution environments permit "headless" invocation via operating system commands. Such remote execution capability can be important if certain models must be executed behind a firewall for security or privacy reasons, or if certain models must be run on high-performance computing (HPC) environments or other specialized hardware.

After running a simulation experiment, the user can review the results. In one embodiment, Splash natively supports the R package for statistical analysis, data mining, and visualization. Other packages can be used as well. For example, visualized results from sample runs of a composite model can be formed by plotting a few simple graphs such as the one shown in FIG. 6, using FusionCharts.

In the example with a simple proof-of-concept model on synthetic data, the results can be viewed merely as illustrative and not necessarily realistic. Nonetheless, the graphs illustrate some interesting phenomena. The first graph shows that the average BMI of our hypothetical population decreases over time as a consequence of the opening of a healthy and inexpensive grocery store in a poor neighborhood. The decrease in BMI is more noticeable for the poor population than for the wealthy population, because the latter population already had good access to healthy food prior to the opening of the new store. This simulation assumes that the roads around the store are engineered so that the presence of the new store does not cause additional traffic delays. The second graph shows what happens if the roads are not re-engineered, so that the opening of the new store leads to increased traffic delays. In this scenario, the decrease in BMI becomes much less pronounced. It now takes longer to reach the new grocery store, so fewer people are inclined to shop there and the potential health benefits to the lower-income population are largely unrealized. Thus, even this simple modeling exercise demonstrates the value of combining multiple system models when trying to predict the effect of a proposed health policy decision.

As can be seen, the metadata for component models, datasets, and transformations plays a role in enabling model composition, as well as execution of composite models. In one embodiment, a computer implemented technique can be used that can incorporate one or more processors. In such an embodiment, once a stream of source data are received from a first simulation model, it is determined if data processing compatibility exists between a first simulation model and a second simulation model by i) obtaining metadata relating to said first and second simulation models from a memory and ii) obtaining metadata relating to said second simulation model from said memory. A memory can be one or more locations in an internal or external memory device. A transformation component is then generated using a schema mapping tool for providing compatibility between the two simulation models. If such compatibility does not exist, then the transformation component will be generated by using the metadata relating to the first and second simulation models. Subsequently, a stream of target data is generated by the second simulation model via said transformation component such that the second simulation model uses said stream of source data as input. More than one simulation model can be used such that output from two or more simulation models can be used as input of other simulation models, either serially or in a parallel processing arrangement. This process can be reiterated so that a string of outputs from different simulation models can be used in this way to provide input to a series of other simulation models.

In one embodiment, metadata is expressed in the novel SADL metadata language, which is discussed in the following. SADL provides "schemas and constraints" for models, transformations, and data, enabling interoperability. SADL files for models, data, and mappings are created as part of the Splash registration process.

The SADL information for a component model can include the type of model, inputs and outputs (pointers to SADL files for data sources and sinks), and where and how the model is to be accessed and executed (including the information needed to synthesize a command line). The SADL information for a data source may include the schema, data-source location, commands (if needed) to access the data, temporal and/or spatial metadata, and so on. Schemas may be specified in industry-standard XSD format (a dialect of XML), in which case the SADL file for the corresponding data source contains a pointer to the XSD file. For both models and data, the SADL file may also specify semantics, assumptions, and provenance for models and dataset, e.g., ratings, change history, ownership, access restrictions, and so on.

FIG. 7(a) displays a snippet of the SADL file for the exemplary BMI model. As can be seen, the description language uses XML-style syntax. The file contains information such as the model's owner (i.e., the user who registered this model in Splash) and references about the model, such as scientific papers, URLs, and reviews. The SADL description also contains information about the history of edits made to the SADL file (not shown), a summary description of the model's functionality, and so on. The <Actor> tag contains basic information about the type of Splash actor being described—model, data, or mapping— using extensible taxonomies of models and data sources. In our example, the SADL description states that the BMI model is a continuous-time, deterministic simulation model.

The SADL file also specifies where the model is located and how it is to be executed. In our example, the BMI model resides locally in the directory $EXEC_DIR/Models. However, as indicated on the left of FIG. 2, not all models and data reside locally with respect to Splash. Some of the models or data may be accessed via web-service calls or other remote execution protocols, in which case the precise invocation method is specified in the SADL file. Under the <Arguments> tag, the SADL file references two other SADL files—BMIInput.sadl and BMIOutput.sadl—that describe the data sources corresponding to the inputs and outputs of the BMI model. In general, multiple input and output data sources can be referenced, depending on the data input and output structure of a given model.

SADL files for mappings (not shown here) are similar to those for models, comprising pointers to source and target schema files as well as to the file containing the internal representation of the mapping. Such a SADL file also contains the information needed to invoke the data-transformation code during a simulation run.

FIG. 7(b) shows a snippet of BMIInput.sadl, which describes the input data source expected by the BMI model. In this example, the SADL description states that the data source comprises time-series data in the form of a comma-delimited file. The observations are given at regular intervals, and each tick corresponds to one simulated day of elapsed time. The time appears explicitly in the data file as the tick attribute. The path to this file is given by $EXEC_DIR/Data/BMIInput.del—thus the file is a local file—and the file conforms to the schema described in BMIInput.xsd; a snippet of this latter schema file is shown at the bottom of FIG. 7(b). The BMIInput.sadl file also describes important characteristics of each attribute (i.e., field) in the data source records, such as measurement units and a description of the semantics of the attribute. For example, weight is in pounds, and the associated description states that this measurement is taken before breakfast. Though not shown, the SADL file may also describe general constraints on possible data values, for example, that weight must lie between 0 and 400 pounds or that pre-tax income must exceed after-tax income; such information facilitates both error checking and model composition.

The SADL files contain semantic information about models and data at both high and low levels, such as in the description tags in BMI.sadl and BMIInput.sadl. Such information is crucial for sensible data and model integration. Semantic mismatches are known to be a major impediment when composing models. Dealing automatically with semantic mismatches is very hard, which is the reason that in one embodiment, Splash uses a semi-automatic approach that places a human in the loop while providing powerful tools for model-composition design.

The Splash SADL format encourages detailed semantic information to be maintained for models and data, facilitating semi-automatic avoidance of semantic mismatches. Indeed, the mere process of registering a model or dataset in Splash and generating a SADL file can create valuable documentation. In one possible embodiment, low-level semantic information for each schema attribute can be displayed in the GUIs of FIGS. 4 and 5. The SADL language is extensible, allowing for ongoing enhancements.

In the embodiments and examples discussed, the capabilities and design of the Splash platform are used for combining heterogeneous existing models and data to support complex health decisions. Splash enables cross-domain "what if" analyses that can help avoid unintended consequences and identify truly effective solutions to health issues. However, other models can easily be implemented. In these examples, the discussion has been in the context of an obesity model, but clearly as can be appreciated by those skilled in the art, the modeling can be used with a broad range of applications in healthcare, public health, and areas beyond health.

Figure 8:
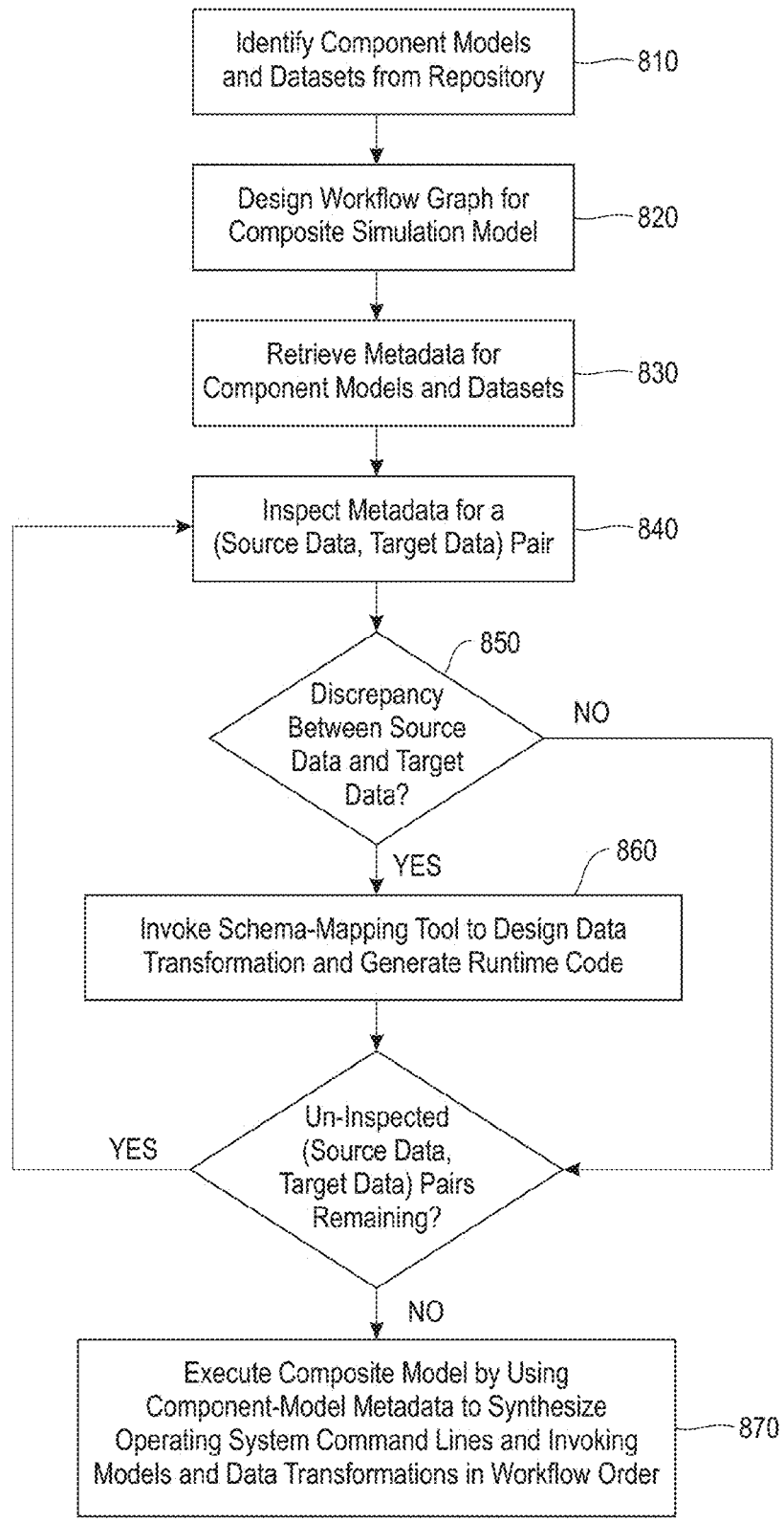
FIG. 8 depicts a flowchart that describes the overall working of the present invention.

FIG. 8 depicts a flowchart that describes the overall working of the present invention. In step 810 a pertinent set of component models and data sets is identified. In step 820 the component models and datasets are arranged in a workflow that defines the structure of a desired composite simulation model. In step 830 the metadata for each component model and dataset are retrieved, where the metadata are represented in a meta-language such as SADL. In steps 840 through 860, the invention examines each (source data, target data) pair. Such pairs correspond to points in the workflow graph at which the output data from a set of models (the source data) is to be used, perhaps in combination with a plurality of component datasets, as input to a target model (i.e., as target data). Using the metadata, the invention automatically determines (step 850) for each pair whether there is a discrepancy between the source and target data. If so, then in step 860 a schema-mapping tool is invoked which the modeler can use to design a structural data transformation that specifies the desired behavior of the transformation component. This specification is then used to automatically generate runtime code for executing the specified transformation. (Other transformations, such as time alignments, can also be created using appropriate tools.) After all transformations are created, the composite simulation model is then executed in step 870, wherein said execution consists of using the metadata for each component model to synthesize an operating system command-line string that executes the model and then invoking the component models and data-transformation codes in the order specified by the composite-model workflow.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for mapping digital model information between computer simulation models comprising:
 receiving, via a processor, a stream of source data from a first simulation model, wherein the source data comprises a structured or unstructured digital information located in a local or remote computer storage device on a network;
 determining, via the processor, data processing compatibility between said first simulation model and a second simulation model by i) obtaining metadata relating to said first simulation model from at least one memory and ii) obtaining metadata relating to said second simulation model from said memory;

generating, via the processor, a transformation component using a schema mapping tool for providing a schema mapping having compatibility between said first and second simulation models upon determination that said compatibility does not exist between said two models, wherein the schema mapping tool is configured to:

synthesize a command-line string for executing the model or mapping code; and generate the transformation component based on a plurality of WL-based Splash Actor Description Language (SADL) metadata files;

said transformation component being generated using said metadata relating to said first and second simulation models, wherein the schema mapping is used in combination with a time-alignment transformation that incorporate space-alignment transformations configured to either interpolate or allocate data values configured to overcome a geospatial mismatch in time scales and a semantic mismatch between said first and second simulation models;

generating, via the processor, a stream of target data for use by said second simulation model via said transformation component; said second simulation model using said stream of target data as input; and transforming, via the processor, the first simulation model and the second simulation model into a combined transformation model using the transformation component and the stream of target data.

2. The method of claim 1, wherein a transformation component is automatically generated when a discrepancy is detected between said stream of source data and said stream of target data.

3. The method of claim 2, wherein said transformation component corrects discrepancies between said stream of source data and said stream of target data.

4. The method of claim 1, further comprising automatically detecting the presence of discrepancies between said stream of source data and said stream of target data.

5. The method of claim 1, further comprising:
synthesizing an operating system command line from a description in meta-language that specifies a plurality of inputs and outputs of one of said simulation models, said command line invoking said one of said simulation models.

6. The method of claim 1, wherein a plurality of simulation models are provided as well as said first and second simulation model and an output of at least two of all available simulation models is used as input to any one of said available simulation models.

7. The method of claim 6, wherein any of said available simulation models that used said output of said at least two simulation models as input also provides output that is used in turn by other simulation models as input.

8. The method of claim 7, wherein said transformation component automatically detects discrepancies between any two of said simulation models.

9. The method of claim 8, wherein said transformation component automatically corrects said detected discrepancies between all said simulation models.

10. The method of claim 6, wherein at least two of said available simulation models are used together as input to a third available simulation model.

11. A nontransitory computer readable storage medium having program code embodied therewith, the program code executable by a computer to:

receive, via a processor, from a first simulation model, a stream of source data, wherein the source data comprises a structured or unstructured digital information located in a local or remote computer storage device on a network;

determine, via the processor, data processing compatibility between said first simulation model and a second simulation model by i) obtaining metadata relating to said first simulation model from a memory and ii) obtaining metadata relating to said second simulation model from said memory;

generate, via the processor, a transformation component using a schema mapping tool for providing a schema mapping having compatibility between said first and second digital simulation models upon determination that said compatibility does not exist between said two models, wherein the schema mapping tool is configured to:

synthesize a command-line string for executing the model or mapping code; and generate the transformation component based on a plurality of WL-based Splash Actor Description Language (SADL) metadata files;

said transformation component being generated, via the processor, using said metadata relating to said first and second simulation models, wherein the schema mapping is used in combination with a time-alignment transformation that incorporate space-alignment transformations configured to either interpolate or allocate data values configured to overcome a geospatial mismatch and a semantic mismatch in time scales between said first and second simulation models;

generate, via the processor, a stream of target data for use by said second simulation model via said transformation component; said second simulation model using said stream of target data as input; and transform the first simulation model and the second simulation model into a combined transformation model using the transformation component and the stream of target data.

12. The computer-readable storage medium of claim 11, wherein said transformation component is automatically created when a discrepancy is detected between said stream of source data and said stream of target data.

13. The computer readable storage medium of claim 12, wherein said transformation component corrects discrepancies between said stream of source data and said stream of target data.

14. The computer readable storage medium of claim 13, further comprising automatically detecting presence of discrepancies between said stream of source data and said stream of target data.

15. The computer readable storage medium of claim 11, further comprising: synthesizing, via the processor, an operating system command line from a description in meta-language that specifies a plurality of inputs and outputs of one of said simulation models, said command line invoking said one of said simulation models.

16. The computer readable storage medium of claim 11, wherein a plurality of simulation models are provided and an output of at least two simulation models are used as input of other simulation models.

17. The computer readable storage medium of claim 16, wherein said simulation models that used said output of said at least two simulation models as input also provide output that is in turn used by other simulation models as input.

18. The computer readable storage medium of claim 17, wherein said transformation component automatically detects discrepancies between all said simulation models.

19. The computer readable storage medium of claim 18, wherein said transformation component corrects discrepancies between all said simulation models.

20. A computer-implemented method for combining for mapping digital model information between computer simulation models, comprising:
receiving, a stream of source data from a first simulation model, wherein the source data comprises a structured or unstructured digital information located in a local or remote computer storage device on a network;
determining data processing compatibility between said first simulation model and a second simulation model by i) obtaining metadata relating to said first simulation model from at least one memory and ii) obtaining metadata relating to said second simulation model from said memory;
specifying, via a processor, a desired behavior of a transformation component using a schema mapping tool for providing descriptions in a meta-language, wherein the schema, in combination with a time-alignment transformation, is configured to either interpolate or allocate data values to overcome a mismatch in time scales between said first and second simulation models;
automatically creating, via the processor, the transformation component from the specified behavior, wherein the transformation component corrects discrepancies between source data and target data by:
synthesizing a command-line string for executing the model or mapping code; and
generating the transformation component based on a plurality of XML-based Splash Actor Description Language (SADL) metadata files;
said transformation component being generated using said metadata relating to said first and second simulation models, wherein the schema mapping is used in combination with a time-alignment transformation that incorporate space-alignment transformations configured to either interpolate or allocate data values configured to overcome a geospatial mismatch and a semantic mismatch in time scales between said first and second simulation models;
generating, via the processor, a stream of target data for use by said second simulation model via said transformation component; said second simulation model using said stream of target data as input; and
transforming, via the processor, the first simulation model and the second simulation model into a combined transformation model using the transformation component and the stream of target data.

21. The method of claim 20, comprising: automatically detecting, via the processor, the presence of the discrepancies.

* * * * *